United States Patent
Wu et al.

(10) Patent No.: US 8,421,425 B1
(45) Date of Patent: Apr. 16, 2013

(54) NON-POSITIVE INDUCTOR CURRENT DETECTOR FOR STEP DOWN SWITCHING REGULATORS

(75) Inventors: Andrew Wu, Campbell, CA (US); Donald Wile, San Jose, CA (US)

(73) Assignee: Adaptive Digital Power, Inc., San Jose, CA (US)

( * ) Notice: Subject to any disclaimer, the term of this patent is extended or adjusted under 35 U.S.C. 154(b) by 373 days.

(21) Appl. No.: 12/889,166

(22) Filed: Sep. 23, 2010

Related U.S. Application Data

(60) Provisional application No. 61/278,107, filed on Oct. 5, 2009, provisional application No. 61/278,108, filed on Oct. 5, 2009, provisional application No. 61/278,109, filed on Oct. 5, 2009, provisional application No. 61/278,127, filed on Oct. 5, 2009, provisional application No. 61/278,128, filed on Oct. 5, 2009, provisional application No. 61/278,129, filed on Oct. 5, 2009.

(51) Int. Cl.
*G05F 1/618* (2006.01)

(52) U.S. Cl.
USPC .......................................... 323/223; 323/282

(58) Field of Classification Search ................... 323/223, 323/282–285; 363/127
See application file for complete search history.

(56) References Cited

U.S. PATENT DOCUMENTS

| | | | |
|---|---|---|---|
| 5,457,624 A * | 10/1995 | Hastings | ....................... 363/127 |
| 6,310,469 B1 | 10/2001 | Bentolila | |
| 7,061,213 B2 | 6/2006 | Yoshida | |
| 7,173,403 B1 | 2/2007 | Chen | |
| 7,675,276 B2 | 3/2010 | Ohkawa | |
| 2005/0057238 A1 | 3/2005 | Yoshida | |
| 2008/0130325 A1 | 6/2008 | Ye | |
| 2009/0079410 A1 | 3/2009 | Ohkawa | |
| 2009/0102444 A1 | 4/2009 | Nonaka | |
| 2009/0315523 A1 | 12/2009 | Kumagai | |
| 2010/0066328 A1 | 3/2010 | Shimizu | |
| 2010/0102788 A1 | 4/2010 | Kumagai | |

FOREIGN PATENT DOCUMENTS

JP        2005253253 A    *  9/2005

* cited by examiner

*Primary Examiner* — Harry Behm
(74) *Attorney, Agent, or Firm* — Tran & Associates

(57) ABSTRACT

A current detector for an output load includes a high side power transistor; a low side power transistor coupled to the high side power transistor; and a controller coupled to the high and low side power transistors to provide cycle by cycle control of the conduction of the high and low side power transistors, wherein if the controller detects zero or negative current in the output inductor, using a dead time between when the low side power transistor turns off and before the high side power transistor turns on, the low side power transistor is held off during the entirety of the next switching cycle.

15 Claims, 5 Drawing Sheets

NON-POSITIVE INDUCTOR CURRENT DETECTOR FOR STEP DOWN SWITCHING REGULATORS

This application claims priority to U.S. Provisional Application Ser. Nos. 61/278,107; 61/278,108; 61/278,109; 61/278,127; 61/278,128; and 61/278,129, all of which were filed on Oct. 5, 2009, the contents of which are incorporated by reference.

BACKGROUND

The present invention relates to systems and methods for performing NPICD for step-down switching regulators.

Discontinuous operation occurs in circumstances of light load when using a non-synchronous buck regulator. In the case of a synchronous BUCK regulator, optimizing the efficiency of the regulator, with light load requires turning off the Low Side FET for a portion of the switching cycle. In this circumstance, the LOW SIDE FET is disabled for one switching cycle after the cycle in which the inductor current has reversed direction or has zero volts across the inductor prior to turning on the High Side FET. Turning off the LOW SIDE FET in this circumstance improves the light load efficiency by preventing needless discharge of the output capacitor and by reducing the switching losses due to turning on and off the NFET. Determination is made during the time the Low Side FET is off and prior to the turn on of the High Side FET, by sensing the voltage polarity across the Low Side Body diode. Ideally the LOW SIDE FET is shut off and held off (for the remainder of the switching cycle) when the inductor current reverses. However with light loads, there are still significant efficiency benefits, if the low side FET is held off for the entirety of the switching cycle (as opposed to only a portion of the switching cycle). In this case the BUCK regulator is operating non-synchronously.

FIG. 1 shows a conventional implementation for turning off the Low side FET, represented by "NFET" 14, in the circumstance when negative current in the inductor is present. Negative inductor current is defined as current flowing from the inductor into either the high or low side power transistors. FET 18 is a pull up and is connected between VDD and NFET 14. If negative current is not present in inductor 20 then the output of comparator 30 is LOW and flip flop (FF) 10 is SET when NFET 14 control goes HIGH. In this case, the LOW SIDE FET is turned on as both inputs to AND 12 are asserted HIGH. If after the LOW SIDE FET is on, the current in inductor 20 goes negative, comparator 30 output goes HIGH and is sent to AND 40 when NFET control is high, thus resetting FF 10 and forcing the Q output LOW, thereby shutting off the NFET 14.

In the circuit of FIG. 1, detection of negative current occurs while the LOW SIDE FET is turned on. LOW SIDE FET on resistance is typically very low (a few milliohms) for optimal efficiency. As such the voltage generated (due to negative inductor current) at the input to the comparator can be very small (in the order of a few mille volts) particularly since it is important to detect small negative currents (for optimal efficiency).

Small input voltages to the comparator are problematic in two regards: 1. Input offsets to the comparator can cause erroneous operation 2. Small overdrive typically translates to slow comparator response time. Overcoming these two issues greatly complicates the design and efficiency gain of the implementation of FIG. 1. Overcoming the offset issue forces the comparator 30 to be implemented with either large input structures or switch capacitor techniques either of which require more die area. Often a known comparator offset is introduced to swamp out the random offset. This fixed offset forces the detected negative current to be larger than would otherwise be necessary, thereby degrading the efficiency of the circuit. The small overdrive forces the current burned in the comparator 30 to be high in order to speed up the circuit. This in turn degrades the efficiency of the circuit.

SUMMARY

In one aspect current detector for an output load includes a high side power transistor; a low side power transistor coupled to the high side power transistor; and a controller coupled to the high and low side power transistors to provide cycle by cycle conduction of the low side power transistor after detection of zero or negative current in the output load.

In another aspect, a system includes a step-down switching regulator to supply power to an output load including an inductor; and a current detector coupled to the output inductor to detect a non-positive inductor current with a high side power transistor; a low side power transistor coupled to the high side power transistor; and a controller coupled to the high and low side power transistors to provide cycle by cycle conduction of the low side power transistor after detection of zero or negative current in the output inductor.

Implementations of the above aspects can include one or more of the following. The controller detects zero or negative current in the output inductor using a dead time between when the low side power transistor turns off and before the high side power transistor turns on. The controller detects a condition when the high side power transistor and low side power transistor are off and the positive or negative going voltage at the switch node output of a switching regulator exceeds a predetermined voltage. The low and high side power transistors can be field effect transistors (FETs), and each FET is coupled to a body diode. A comparator is connected to a junction between the high and low side power transistors. A logic gate can be connected to the comparator. A flip-flop can be connected to the comparator.

In a further aspect, a current detector for an output load with an inductor can include a high side power field effect transistor (FET); a low side FET coupled to the high side FET; and a controller coupled to the high and low side FETs to provide cycle by cycle conduction of the low side power transistor.

Implementation of the above aspect can include the following. The controller can have a means to detect zero or negative current in the output inductor of a synchronous switching regulator using the dead time between when the low side FET turns off, before the high side FET turns on; and a means to detect when the high side FET and low side FET are off and the positive or negative going voltage at a switch node output of a switching regulator exceeds a threshold voltage.

Advantages of the preferred embodiments may include one or more of the following. The Non-Positive Inductor Current Detector (NPICD) provides an effective means to determine when to turn off the Low Side FET to optimize efficiency. It does this by determining when the current in the inductor reaches zero or goes negative (i.e. is non-positive) without the need for detecting the small voltages as conventionally required. As such the design, power requirements and offset sensitivity of the comparator are greatly improved as well as the overall efficiency of the regulator. Rather than detecting the zero current condition while the LOW SIDE FET is on, the NPICD detects this condition during the dead time when both the High Side and Low Side FETs are off.

DESCRIPTION

Figure 1:
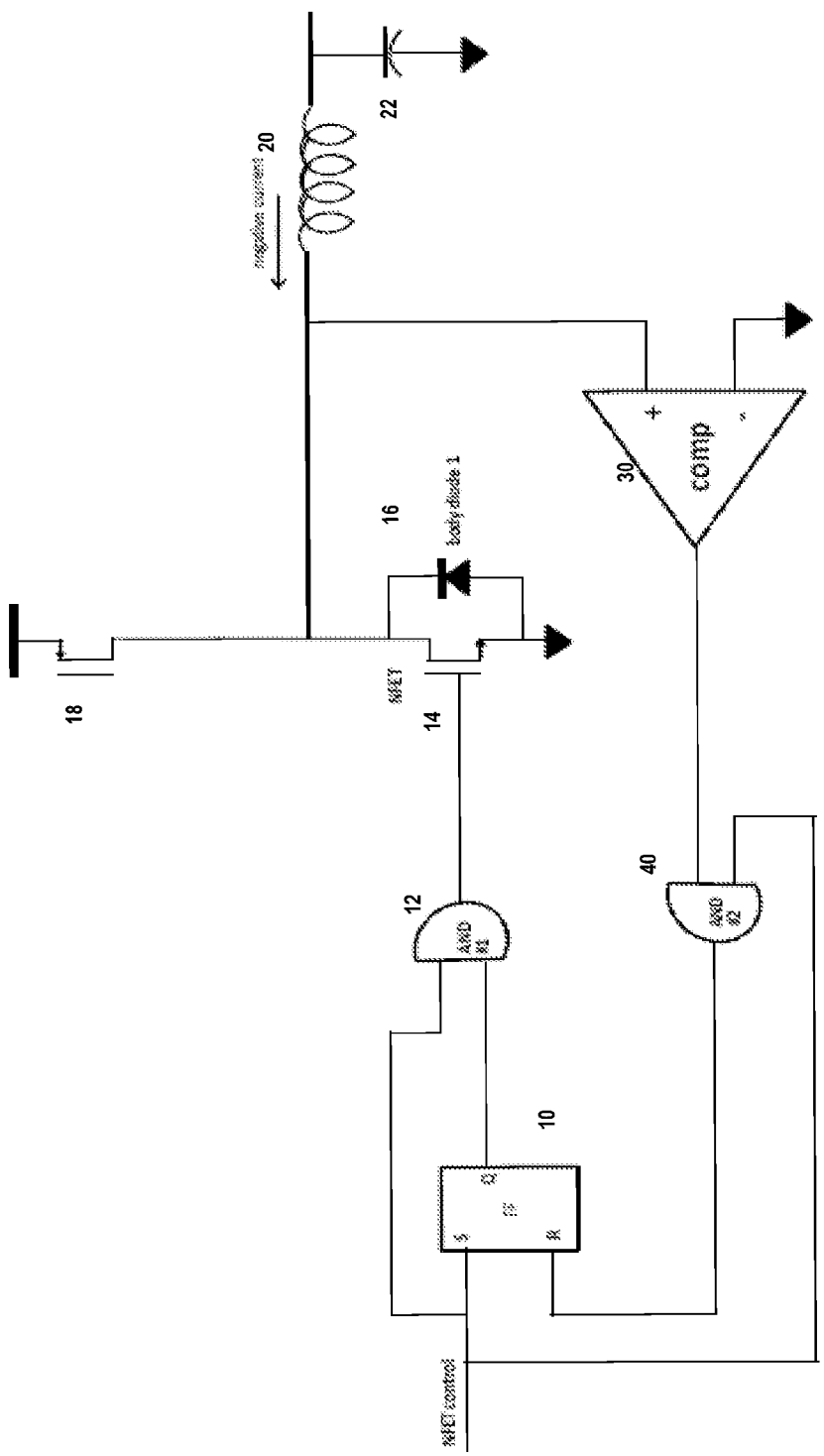
FIG. 1 shows a conventional implementation of an inductor current detector.
Figure 2:
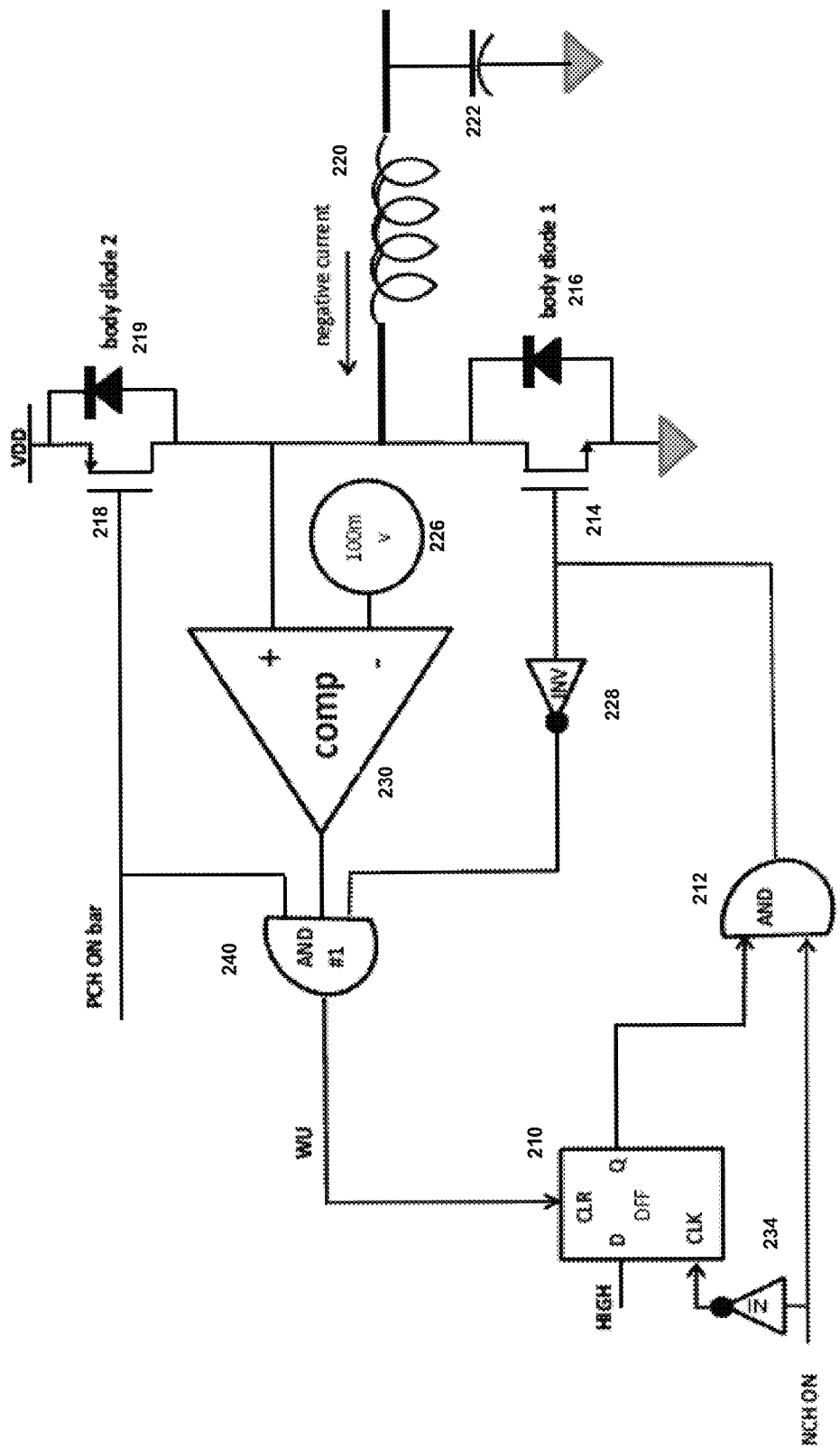
FIG. 2 shows one implementation of NPICD in accordance with the invention.

FIG. 2 shows one implementation of NPICD in accordance with the invention. An inductor 220 is connected at a junction between a LOW SIDE FET 214 and a HIGH SIDE FET 218. A capacitor 222 is connected to the other end of the inductor 220. The LOW SIDE FET 214 has a body diode 216, while the HIGH SIDE FET 218 has a body diode 219. Periodically, the inductor 220 provides negative current that is sensed by a comparator 230 by comparing the output voltage against a reference source 226. The comparator 230 is connected to an AND gate 240 outputting a WU signal. The AND gate 240 is also connected to the gate of HIGH SIDE FET 218 (PCH_ON bar signal) as well as the output of inverter 228. The inverter 228 is connected to the gate of the LOW SIDE FET 214, which is driven by AND gate 212. A flip-flop 210 is cleared by the WU signal and is set through an inverter 234 when NCH_ON goes LOW. The flip-flop 210 provides the output to the AND gate 212 to turn on or off the LOW SIDE FET 214.

If there is only positive current in the inductor 220, during the time between when the LOW SIDE FET 214 turns off and the PFET 218 turns on (i.e. the "dead time") the output voltage at the switch node (i.e. the drains of the PFET and NFET) goes negative as body diode 216 continues to conduct the positive going current. With the switch node negative, the comparator 230 output is LOW, as is the output of AND 240. With AND 240 at the LOW state, the D input flip flop (DFF) 210 is not cleared and the Q output remains HIGH for the next cycle. The Q output is driven HIGH when the NCH ON signal goes LOW which clocks the D input flip flop 210. With the Q output HIGH, the next NCH ON signal passes though AND gate 212 to the gate input of the LOW SIDE FET 214 allowing it to be controlled by the NCH ON signal.

If the inductor current is negative immediately after the LOW SIDE FET 214 shuts off and before the PFET 218 turns on the switch node immediately swings positive as the negative current conducts though body diode 219. The comparator 230 detects this positive voltage and goes HIGH as does the output of AND 240. As the PFET is off, the GATE of the PFET is HIGH and because the LOW SIDE FET 214 is off, the output of the inverter 228 connected to the GATE of the LOW SIDE FET 214 is also HIGH. With the WU signal HIGH, the D flip flop 210 is cleared and the Q output goes LOW. As the cycle continues, the PFET turns on and off, then the NCH ON signal is asserted. However, the DFF 210 remains cleared as it is only SET when the NCH ON signal is de-asserted. Consequently, the NCH ON signal does not pass through AND 212 and the LOW SIDE FET 214 remains off.

The signal detected by the comparator 230 is a very large signal near the supply rail. This large overdrive quickly moves the comparator output and swamps out any offsets in the comparator. Another case to consider is light load continuous operation wherein the current in the inductor transitions from a positive to a negative current part way through a switching cycle. This might happen, for example, if there is little or no load on the BUCK regulator output. In this circumstance, immediately after the HIGH SIDE FET 218 turns off and before the LOW SIDE FET 219 turns on, the voltage at the switch node output goes negative as body diode 216 continues to conduct the positive inductor current initiated when the HIGH SIDE FET 218 was on. If the LOW SIDE FET 214 turns on, the current decays and turns negative which will then be detected at the end of the switch cycle (i.e. when the LOW SIDE FET 214 turns off). From then on, the LOW SIDE FET 214 will remain off.

When transitioning from light load to heavy loads, the Low Side FET 214 will transition from being disabled to enabling every cycle automatically. As current increases in the inductor the operation moves from discontinuous conduction mode to continuous conduction mode. This becomes the case where there is only positive current in the inductor. In this circumstance, body diode 216 conducts current for the entirety of the dead time and the WU signal is never asserted. Though the previous examples have illustrated the operation of the NPICD detector with negative current, the NPICD does not require negative current to detect when to turn off the NFET. For example, in the no or light load circumstance when the HIGH SIDE FETS 218 is turned off and the LOW SIDE FET 214 has been held off by the NPICD, the voltage at the switching node does not necessarily swing sufficiently positive to turn on body diode 219. In this circumstance the voltage at the switch node is driven to the output voltage of the BUCK regulator though the inductor (after the positive current from the PFET being on decays in the inductor).

The switch node can exhibit "ringing" due to the resonance of the output inductor and the stray capacitance at the switch node. However, the center point of the ringing is equal to the BUCK regulator output voltage. This occurs as an ideal inductor cannot sustain a DC voltage across it. In any case, this voltage is sufficiently positive to provide a large amount of over drive to the comparator and to sustain the off condition of the LOW SIDE FET 214.

In the discontinuous mode of operation, the NPICD operates to hold off the LOW SIDE FET 214 for the entirety of the switching cycle. This means that the body diode 216 will conduct current for a portion of the cycle. This body diode conduction introduces some power loss as given by the product of the current through the body diode times the forward diode voltage drop. A more optimal solution would act to turn on the LOW SIDE FET for the portion of the cycle the inductor current is positive, and to turn off the LOW SIDE FET when the inductor current reached zero. This enhanced operation is possible with a modification of the NPICD called the "Adaptive NPICD" and is described in detail in co-pending application serial no. 13562317, the content of which is incorporated by reference.

Figure 3:
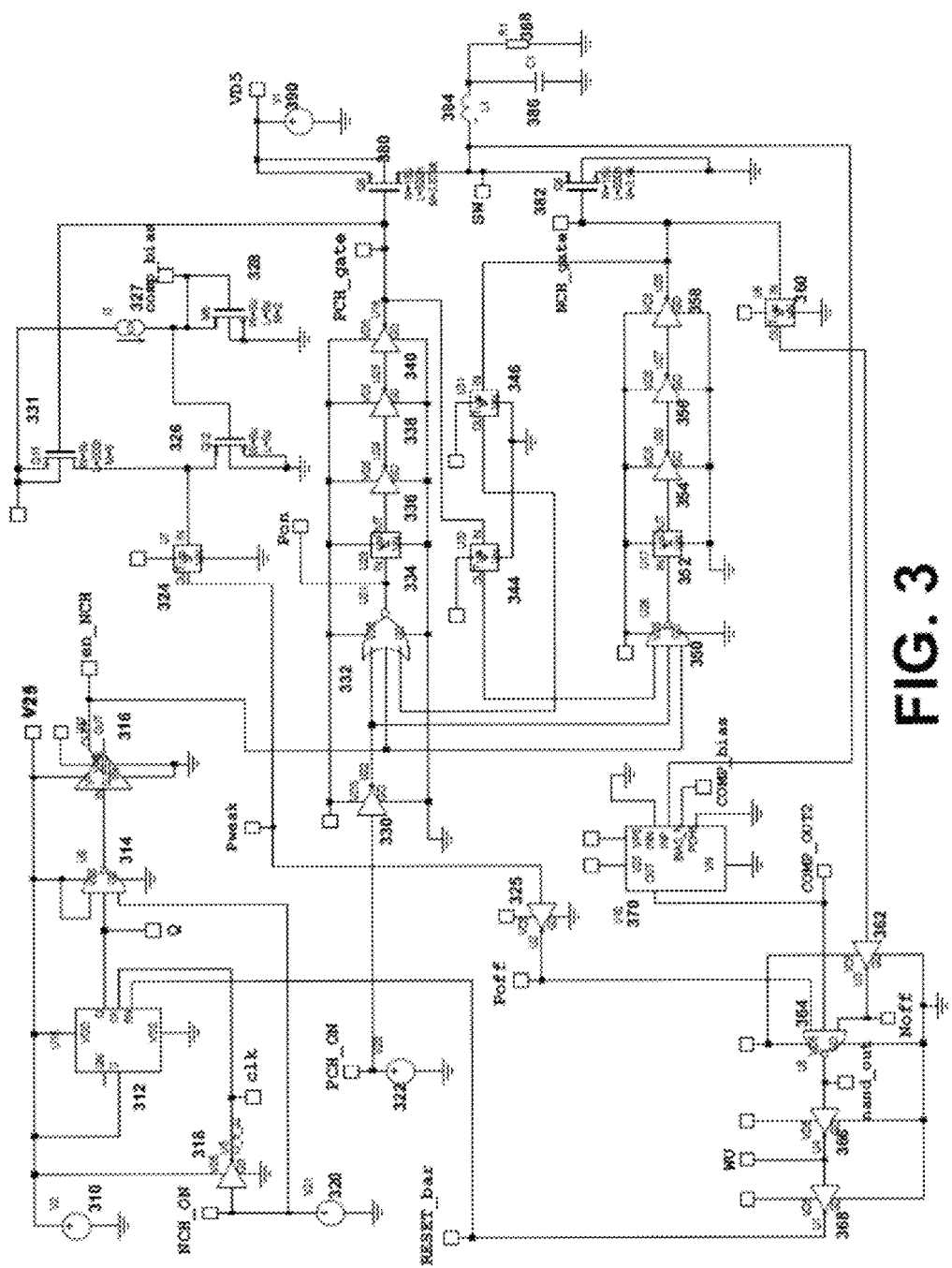
FIG. 3 shows another implementation of NPICD in accordance with the invention.

FIG. 3 shows another implementation of the NPICD. Turning now to FIG. 3, a first voltage source 310 provides a supply rail V25. The output of the FF U15 312 is provided to a NAND U9 314, whose output drives a buffer U37 to generate an output en_NCH.

An NCH_ON generator V21 320 drives a buffer U5 318, which supplies CLK signal to various components in FIG. 3. A PCH_ON generator V20 322 drives an inverter U22 330, whose output is provided to a NOR U21 332. The output of NOR U21 332 is PON signal, which is provided to a Schmitt trigger U29 334. The output of U29 334 is provided to a series of buffers U24 336, U25 338, U18 340, respectively, to generate a PCH_gate output. PCH_gate is provided to Q11 330, which is also connected to Q12 326. Q12 326 receives a current from a current source 327. The current source 327 also drives a transistor M6 328. The output of Q12 326 is provided to a Schmitt trigger U7 324 to generate a Pweak output. Pweak is provided to a inverter U2 whose output is Poff and is provided to NAND U8 364.

Schmitt triggers U31 346 and U30 344 received a signal NCH_gate from U28 358 (described below) and the output of U30 344 is provided to NAND U26 350. The other inputs to NAND U26 350 include en_NCH from U37 316 and the buffered PCH_on from U22 330. NAND U26 350 drives a Schmitt trigger U17 352, whose output is buffered by U20 354, U27 356 and U28 358, respectively, to generate the NCH_gate output provided to Q6 382 and U6 360.

PCH_gate is provided to Q8 380, which receives 5V power from a voltage source 390 driving a VD5 rail. Q8 380 is connected to Q6 382 and to inductor L1 384 in series with capacitor C1 386 and load R1 388 in parallel. Q6 382 is controlled by NCH_gate.

The SW signal at the junction of Q8 380 and Q6 382 is provided to comparator U10 370, whose COMP_OUT2 output is provided to NAND U8 364. Another input of NAND U8 364 is Poff, a buffered version of Pweak from inverter U2 325. Another input of NAND U8 364 is Noff, which is inverted by U3 362 as driven by U6 360. The output of NAND U8 364 is inverted by U4 366 to generate WU signal. The WU signal is inverted again by U1 368, whose output is RESET_bar and provided to U15 312.

The operation of the circuit of FIG. 3 is the same as previously described for the circuit of FIG. 2, with differences. The circuit is implemented with multiple supply rails (i.e. V25=2.5V and VD5=5.0V) and uses a level translator U37. The 100 mv comparator offset is built into the comparator U10 370. Biasing circuits Q11 330, Q12 326, M6 328 and I3 327 are included. The LOW SIDE FET and PFET body diodes are not explicitly shown. Schmitt trigger circuits, U7 324, U29 334, U30 344, U31 346, U17 352, U6 360 are used to buffer certain logic signals to prevent noise glitches due to bouncing grounds and supply. Gate drivers U16 340, U25 338, U24 334, U28 358, U27 356, U20 354 are used to provide enough drive strength and speed to drive the large gate capacitance of the output P and N FETs. Anti cross conduction protection circuits U21 332 and U26 350 are used. Q11 330 is used to generate a logic signal that indicates the PFET is off. This signal is used to properly time align the signal with the other control signals.

Figure 4:
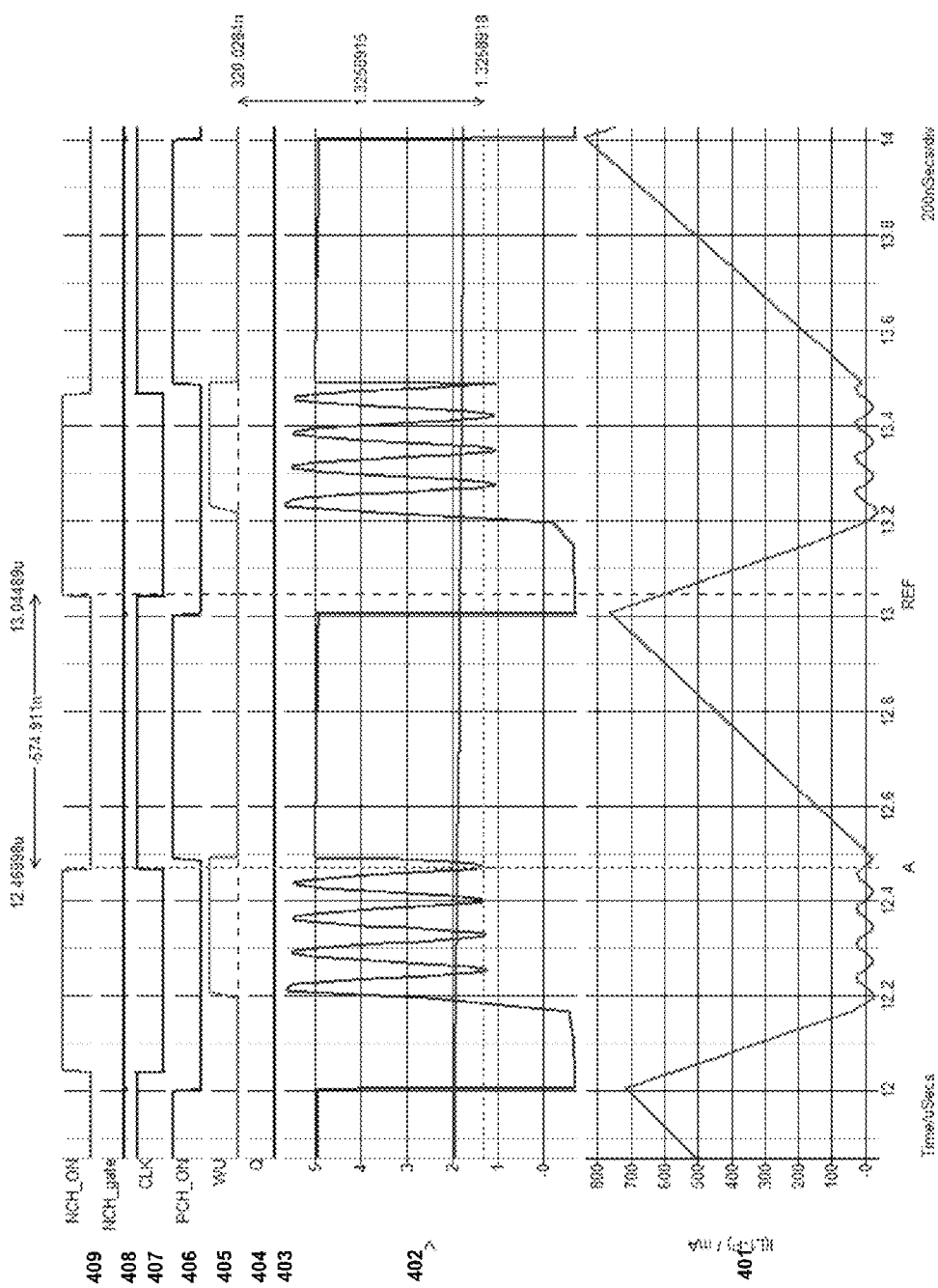
FIG. 4 shows exemplary waveforms from a simulation of the circuit of FIG. 3 with NPICD enabled.
Figure 5:
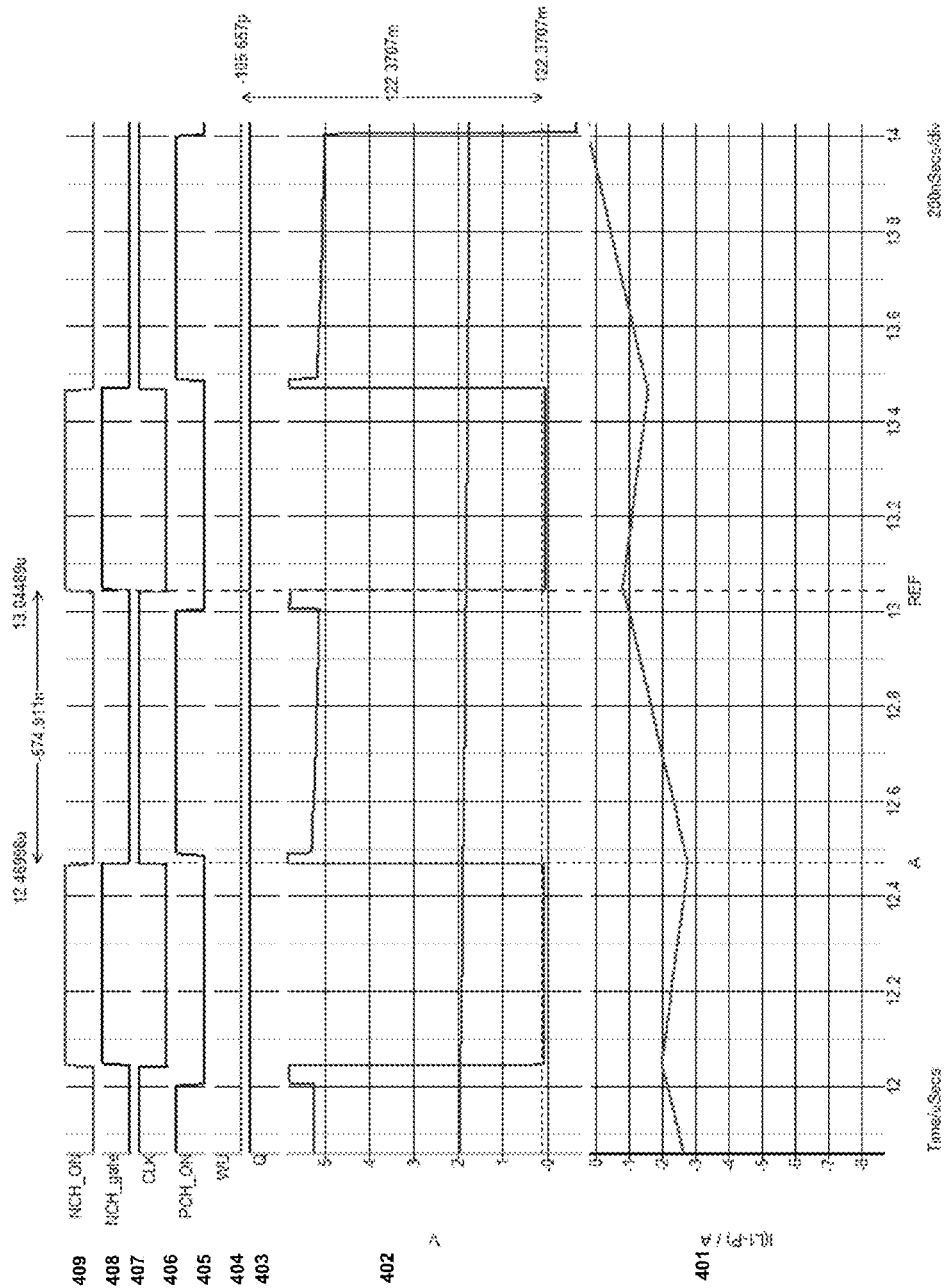
FIG. 5 shows exemplary waveforms from a simulation of the circuit of FIG. 3 with NPICD enabled.

FIG. 4 shows exemplary waveforms from a simulation of the circuit of FIG. 3 in an exemplary circumstance that would otherwise have negative inductor currents if the NPICD were not active (see FIG. 5). In FIG. 4, signal 401 represents the inductor current. The inductor current does not go negative because the NPICD is holding off the NFET. Signal 402 represents the switch node output voltage. This voltage immediately goes positive when the inductor current reaches 0 with the PFET off. Signal 403 represents the regulator output voltage. The switch node rings about this voltage. Signal 404 represents the Q output of the D flip flop 210. The flip flop is always cleared. Signal 405 represents the WU signal of AND 240. When HIGH, the D flip flop is cleared. The WU signal is generated when the PFET is off, the SW node is >100 mV and the LOW SIDE FET is off (i.e. NCH_gate). Signal 406 represents the PFET control signal. A HIGH level commands the PFET to turn ON. Signal 407 represents the CLK of the D flip flop. This is generated at the end of each switching cycle when NCH_ON goes low. Signal 408 represents the NCH_gate, the gate voltage of the NFET. The signal is always LOW indicating the LOW SIDE FET never turns on. Signal 409 represents NCH_ON, the LOW SIDE FET control signal. In the absence of the NPICD a HIGH level on this signal would turn on the NFET.

FIG. 5 shows the same simulation of the circuit of FIG. 3 except the NPICD has been disabled. Signal 401 of FIG. 5 shows that the inductor current goes negative. This is because the NPICD is disabled and the LOW SIDE FET is allowed to turn on (NCH_gate goes HIGH). Signal 402 shows the switch node output voltage, which immediately goes positive with negative inductor current when the PFET is off. Signal 403 is the regulator output voltage. Signal 404 shows the Q output of the D flip flop, which is always set allowing the NCH_ON signal to control the LOW SIDE FET gate (NCH_gate). Signal 405 shows that WU is off because the NPICD is disabled. Signal 406 shows the PFET control signal where a HIGH level commands the PFET to turn ON. Signal 407 shows CLK input of the D flip flop 210. This is generated at the end of each switching cycle when NCH_ON goes low. Signal 408 shows the output of NCH_gate, the gate voltage of the NFET. Notice the LOW SIDE FET turns on and off even with negative inductor current, because the NPICD is disabled. Signal 409 is the NCH_ON signal where, in the absence of the NPICD, a HIGH level on turns on the NFET.

Although the examples given above describe inductor current detector circuits, one skilled in the art will appreciate that the technique can be applied to other circuit functions for operation in similar fashion. It will be understood from the foregoing description that various modifications and changes may be made in the preferred and alternative embodiments of the present invention without departing from its true spirit. For example, the FETs may be implemented using MOS transistors, bipolar transistors, or other suitable switching devices, the circuit may include a subset or superset of the elements described in the examples above, the method may be performed in a different sequence, the components provided may be integrated or separate, the devices included herein may be manually and/or automatically activated to perform the desired operation.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. A current detector for an output inductor, comprising
   a. a high side power transistor;
   b. a low side power transistor coupled to the high side power transistor; and
   c. a controller coupled to the high and low side power transistors to provide cycle by cycle control of the conduction of the high and low side power transistors, wherein if the controller detects zero or negative current in the output inductor during a dead time between when the low side power transistor turns off and before the high side power transistor turns on, the controller disables the low side power transistor during a subsequent switching cycle;
   d. a comparator coupled to a junction between the high and low side power transistors;
   e. a first logic gate coupled to the comparator, to the low side power FET control and the high side power FET control;
   f. a flip-flop coupled to the first logic gate; and g. a second logic gate whose inputs are coupled to the output of the flip-flop and to a controller output low side power FET control, and whose output is coupled to the low side power FET control.

2. The current detector of claim 1, comprising multiple voltage supply rails to power the controller and the power transistors.

3. The current detector of claim 1, wherein the controller detects a condition when the high side power transistor and low side power transistor are off and the positive or negative going voltage at a switch node output between the high side power transistor and the low side power transistor exceeds a predetermined voltage.

4. The current detector of claim 3, wherein the controller prevents the turn on of the low side power transistor in a subsequent switching cycle if the condition is detected.

5. The current detector of claim 3, wherein the controller allows the turn on of the low side power transistor in a subsequent switching cycle if the condition is not present.

6. The current detector of claim 1, wherein the power transistors generates a step-down output voltage.

7. A system, comprising:
   a. a step-down switching regulator to supply power to an output load including an inductor; and
   b. a current detector coupled to the output inductor to detect a non-positive inductor current, comprising:
      i. a high side power transistor;
      ii. a low side power transistor coupled to the high side power transistor; and
   a. a controller coupled to the high and low side power transistors to provide cycle by cycle control of the conduction of the high and low side power transistors, wherein if the controller detects zero or negative current in the output inductor during a dead time between when the low side power transistor turns off and before the high side power transistor turns on, the controller disables the low side power transistor in a subsequent switching cycle;
   b. a comparator coupled to a junction between the high and low side power transistors;
   c. a first logic gate coupled to the comparator, to the low side power transistor control and the high side power transistor control;
   d. a flip-flop coupled to the first logic gate; and
   e. a second logic gate whose inputs are coupled to the output of the flip-flop and to a controller output low side power transistor control, and whose output is coupled to the low side power transistor gate.

8. The system of claim 7, comprising a plurality of voltage supply rails to power the transistors and the controller.

9. The system of claim 7, wherein the controller detects a condition when the high side power transistor and low side power transistor are off and the positive or negative going voltage at the switch node output of a switching regulator exceeds a predetermined voltage.

10. A power supply, comprising
   a. a high side power transistor;
   b. a low side power transistor coupled to the high side power transistor; and
   c. a controller coupled to the high and low side power transistors to provide cycle by cycle control of the conduction of the high and low side power transistors, wherein if the controller detects zero or negative current in the output inductor during a dead time between when the low side power transistor turns off and before the high side power transistor turns on, the controller disables the low side power transistor during a subsequent switching cycle;
   d. a comparator coupled to a junction between the high and low side power transistors;
   e. a first logic gate coupled to the comparator, to the low side power FET control and the high side power FET control;
   f. a flip-flop coupled to the first logic gate; and
   g. a second logic gate whose inputs are coupled to the output of the flip-flop and to a controller output low side power FET control, and whose output is coupled to the low side power FET control.

11. The power supply of claim 10, comprising a plurality of voltage supply rails to power the transistors and the controller.

12. The power supply of claim 10, wherein the controller detects a condition when the high side power transistor and low side power transistor are off and the positive or negative going voltage at the switch node output of a switching regulator exceeds a predetermined voltage.

13. The power supply of claim 10, wherein the controller prevents the turn on of the low side power transistor in a subsequent switching cycle if the condition is detected.

14. The power supply of claim 10, wherein the controller allows the turn on of the low side power transistor in a subsequent switching cycle if the condition is not present.

15. The power supply of claim 10, wherein the power transistors generates a step-down output voltage.

* * * * *